(12) United States Patent
Chang et al.

(10) Patent No.: US 6,461,949 B1
(45) Date of Patent: Oct. 8, 2002

(54) METHOD FOR FABRICATING A NITRIDE READ-ONLY-MEMORY (NROM)

(75) Inventors: Kent Kuohua Chang, Taipei (TW); Chia-Hsing Chen, Hsin-Chu (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/820,305

(22) Filed: Mar. 29, 2001

(51) Int. Cl.$^7$ .......................................... H01L 21/4763
(52) U.S. Cl. ........................ 438/585; 438/591; 438/257
(58) Field of Search ................................. 438/584, 585, 438/591, 592, 763, 785, 396, 257

(56) References Cited

U.S. PATENT DOCUMENTS 5,552,337 A * 9/1996 Kwon et al. ................. 438/696
6,251,761 B1 * 6/2001 Rodder et al. ............... 438/591

* cited by examiner

Primary Examiner—David Nelms
Assistant Examiner—Dung A Le
(74) Attorney, Agent, or Firm—Winston Hsu

(57) ABSTRACT

The present invention provides a method of fabricating an improved gate of a nitride read only memory (NROM) in a semiconductor wafer. A bottom oxide and a silicon nitride layer are first formed on the surface of a silicon substrate in the semiconductor wafer, respectively, followed by injecting a tantalum penta ethoxide ($Ta(OC_2H_5)_5$), under the condition of 300 mTorr and 200–650° C., to form a tantalum pentaoxide ($Ta_2O_5$) layer as a top oxide layer. The top oxide layer, silicon nitride layer and the bottom oxide layer compose an oxide-nitride-oxide (ONO) dielectric structure. Finally, a gate conductor layer is formed on the surface of the ONO structure to complete the fabrication of the NROM of the present invention. The tantalum pentaoxide has a high dielectric constant and is used to reduce the control gate voltage and thermal budget so as to increase the coupling ratio and yield of the semiconductor wafer.

7 Claims, 3 Drawing Sheets

METHOD FOR FABRICATING A NITRIDE READ-ONLY-MEMORY (NROM)

FIELD OF THE INVENTION

The present invention provides a method of fabricating a gate in a nitride read only memory (NROM).

DESCRIPTION OF THE PRIOR ART

A read only memory (ROM) device, composed of a plurality of memory cells, is a kind of semiconductor wafer device that functions in data storage. The ROM device is widely applied to computer data storage and memory. Depending on the method of storing data, the ROM can be divided into several types such as a mask ROM, programmable ROM (PROM), erasable programmable ROM (EPROM), and an electrically erasable programmable ROM (EEPROM).

Differing from other types of ROMs that use a polysilicon or metal floating gate, a nitride read only memory (NROM) uses an insulating dielectric layer as a charge-trapping medium. Due to the highly-compacted nature of the silicon nitride layer, hot electrons tunneling from the MOS transistor into the silicon nitride layer are trapped within to form an unequal concentration distribution to hasten data reading speed and to avoid current leakage.

Please refer to FIG. 1. FIG. 1 is a schematic diagram of a standard structure of an NROM according to the prior art. A semiconductor wafer 10 comprises a P-type silicon substrate 12, two N-type doped areas 14, 16 positioned on the surface of the silicon substrate 12, an ONO dielectric structure 24, and a gate conductor layer 26 positioned on the ONO dielectric structure 24. The ONO dielectric structure 24 is composed of a bottom oxide layer 18, a silicon nitride layer 20 and a top oxide layer 22.

Please refer to FIG. 2 and FIG. 3. FIG. 2 and FIG. 3 are schematic diagrams of a method for fabricating an NROM using the standard structure shown in FIG. 1. As shown in FIG. 2, according to the prior art for fabricating a gate of the NROM, a semiconductor wafer 30 comprising a P-type silicon 32 is first provided. A high temperature oxidation process is then performed to form an oxide layer with a thickness of 50–150 angstroms as a bottom oxide layer 34 on the surface of the silicon substrate 32. Next, a low-pressure chemical vapor deposition (LPCVD) is used to deposit a silicon nitride layer 36 with a thickness of 50–150 angstroms on the bottom oxide layer 34. An annealing process is then used under a high temperature of 950° C. for a duration of 30 minutes to repair the structure of the silicon nitride layer 36. As well, water steam is injected to perform a wet oxidation process to form a silicon oxy-nitride layer with a thickness of the 50–150 angstroms as a top oxide layer 38. The bottom oxide layer 34, the silicon nitride layer 36 and the top oxide layer 38 compose the ONO dielectric structure 40 on the surface of the silicon substrate 32.

As shown in FIG. 3, a photolithographic and etching process is performed to form a gate pattern in the top oxide layer 38 and silicon nitride layer 36. An ion implantation process is then performed to form a plurality of doped areas 42 as a source and drain in the MOS transistor. Thereafter, a thermal oxidation process is used to form a field oxide (FOX) 44 on the surface of the source/drain to isolate each silicon nitride layer 36. Finally, a doped polysilicon layer 46 is deposited as a gate conductor layer.

According to the prior art for forming a top oxide layer, the process requires higher temperature and thermal budget to form an oxide layer on the surface of the nitride compound. Thus, not only is greater cost needed, but the higher temperature may lead to the degradation of the gate oxide layer and affect the reliability of the NROM. Moreover, because of the low dielectric constant of silicon oxide, the top oxide layer comprises lower coupling ratio and higher control gate voltage.

SUMMARY OF THE INVENTION

It is therefore a primary objective of the present invention to provide a gate fabrication method of an NROM with high dielectric constant of the top oxide layer to solve the above-mentioned problems.

In accordance with the claim invention, the method first forms a bottom oxide layer and a silicon nitride layer on the surface of a silicon substrate in the semiconductor wafer, respectively followed by injecting a tantalum penta ethoxide ($Ta(OC_2H_5)_5$), under the condition of 300 mTorr and 200–650° C., to deposit a tantalum pentaoxide ($Ta_2O_5$) layer as a top oxide layer.

It is an advantage of the present invention that the present invention uses tantalum pentaoxide, having a high dielectric constant, as a top oxide layer of the ONO dielectric layer, to thereby increase the coupling ratio, reduce both the control gate voltage and thermal budget of the fabrication, and to avoid the problem of gate oxide degradation due to high temperature so as to improve the production yield of the semiconductor wafer.

These and other objectives of the present invention will no doubt become obvious to those of ordinary skill in the art after reading the following detailed description of the preferred embodiment, which is illustrated in the various figures and drawings.

DESCRIPTION OF THE PREFERRED EMBODIMENT

Figure 1:
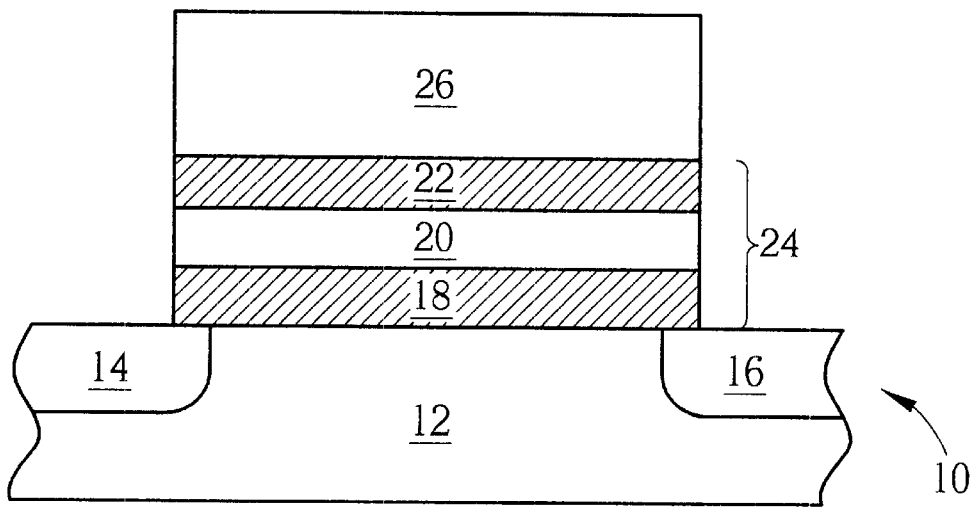
FIG. 1 is a schematic diagram of a standard structure of an NROM according to the prior art.
Figure 2:
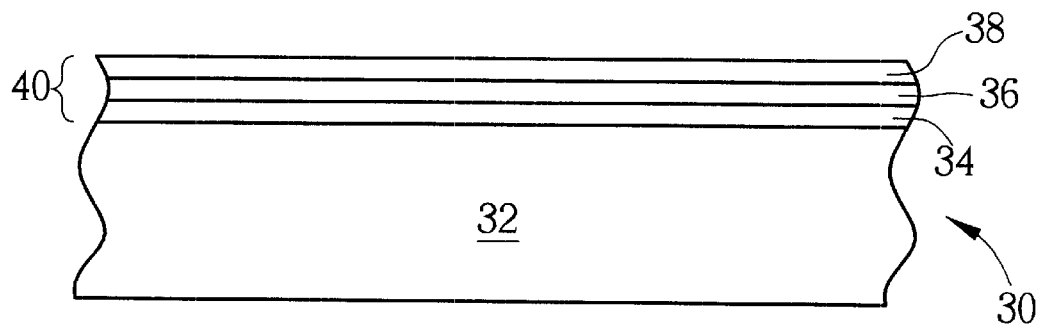
FIG. 2 and FIG. 3 are schematic diagrams of a method for fabricating an NROM using the standard structure shown in FIG. 1.
Figure 3:
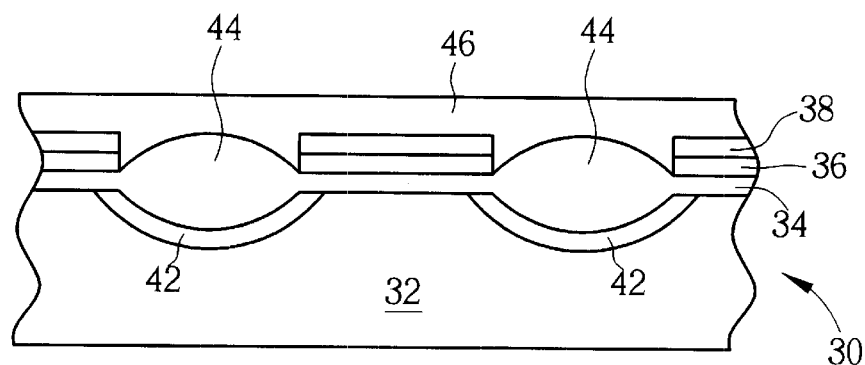
Figure 4:
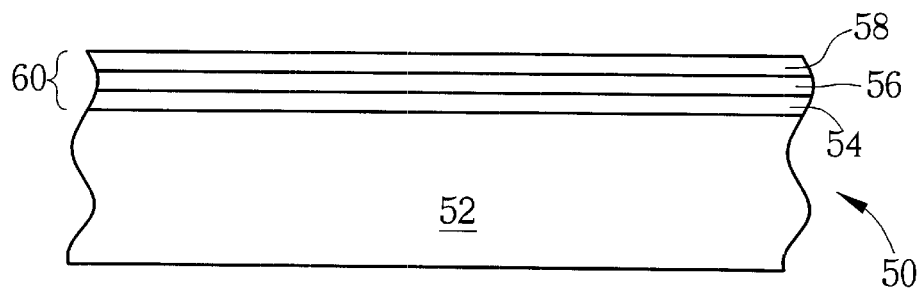
FIG. 4 to FIG. 6 are schematic diagrams of a method for fabricating an NROM according to the prior invention.
Figure 5:
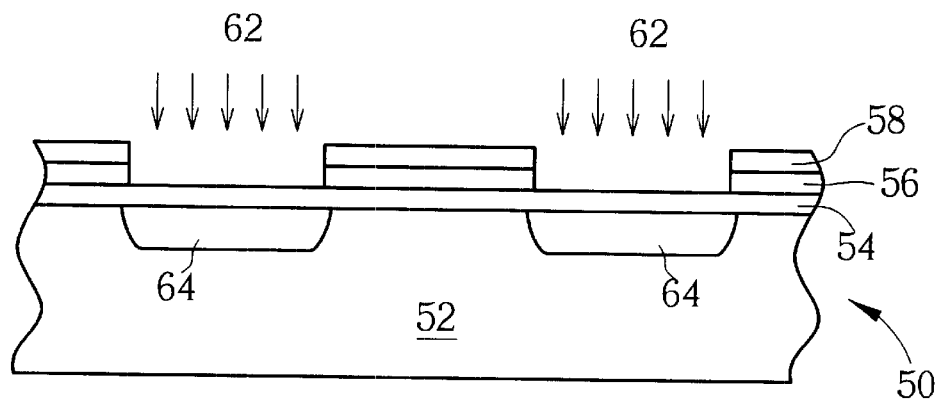
Figure 6:
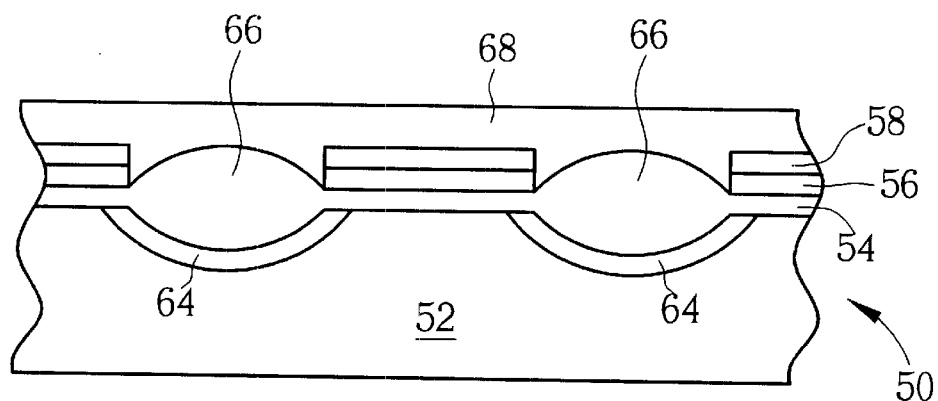

Please refer to FIG. 4 to FIG. 6. FIG. 4 to FIG. 6 are the schematic diagrams of a method for fabricating an NROM according to the present invention. As shown in FIG. 4, the NROM according to the present invention is fabricated on the surface of the silicon substrate 52 in a semiconductor wafer 50. The silicon substrate 52 is a P-type silicon substrate, but the present invention is not limited to only this substrate type.

The present invention first forms an ONO dielectric layer 60 with a thickness of 150–250 angstroms on the surface of the silicon substrate 52. The method of fabricating an ONO dielectric structure 60 according to the present invention first involves performing a high temperature oxidation process to form an oxide layer with a thickness of 50–150 angstroms as a bottom oxide layer 54 on the surface of the substrate 52. A LPCVD process is then performed by injecting a reaction gas mixture of dichlorosilane ($SiH_2Cl_2$) and ammonia ($NH_3$) under the condition of 700–800° C. temperature and low pressure to form a silicon nitride layer 56 with a thickness of 50–150 angstroms on the surface of the bottom oxide layer 54.

Next, a chemical vapor deposition (CVD) process is used under the condition of 200–650° C. temperature and 200–600 mTorr by injecting tantalum penta ethoxide (Ta(OC$_2$H$_5$)$_5$) with a flowrate of 5–20 mg/min, oxygen with a flowrate of 500–2000 sccm(standard cubic centimeter per minute) and helium gas (He) as a carrier gas with a flowrate of 200–600 sccm, to form a tantalum pentaoxide layer (Ta$_2$O$_5$) with a thickness of 60–800 angstroms as a top oxide layer 58 on the surface of the silicon nitride layer 56. The reaction step is as follows:

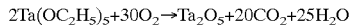

$$2Ta(OC_2H_5)_5 + 30O_2 \rightarrow Ta_2O_5 + 20CO_2 + 25H_2O$$

In the preferred embodiment of the present invention, a reaction is performed at a temperature of 480° C., a pressure of 300 mTorr and a carrier gas (He) flowrate of 300 sccm, and tantalum penta ethoxide is injected at 7.5 mg/min and oxygen is injected at 1000 sccm to a form tantalum pentaoxide layer via CVD deposition with a thickness of 100 angstroms. The bottom oxide layer 54, silicon nitride 56 and the top oxide layer 58 compose an ONO dielectric structure 60 on the surface of the substrate 52. Since the tantalum pentaoxide, which functions as a top oxide layer 58, is of a high dielectric constant of 25, or equal to 6-fold of silicon oxide (dielectric constant 3.9) and 3-fold of silicon nitride (dielectric constant 7.5), the control gate voltage is efficiently reduced and both the coupling ratio and charge gain are increased.

Next, nitrous oxide (N$_2$O) is injected at a temperature of 800° C. for a duration of 30 seconds to perform a rapid thermal nitridation (RTN)process, functioning as an annealing process, to repair the ONO dielectric structure, and thereby reduce the probability of current leakage of the tantalum pentaoxide and achieve an improved time-dependent dielectric breakdown (TDDB) characteristic of the tantalum pentaoxide film.

As shown in FIG. 5, a photoresist layer (not shown) is formed on the surface of the ONO dielectric structure 60, followed by a photolithographic and etching process to form a column pattern in the photoresist layer on the surface of the ONO dielectric layer 60. Then, the photoresist layer, is used as a mask to perform a ion implantation process 62 so as to form a plurality of doped area 64 functioning as a drain (ie. bit line) and source. As shown in FIG. 6, after removing the photoresist layer, a thermal oxidation process is used to form an oxide layer 66 on the surface of the doped area 64 to isolate each silicon nitride layer 56. Finally, a doped polysilicon layer 68 is deposited as a gate conductor layer (ie. Word line).

In contrast to the prior art method for fabricating a gate of an NROM, the present invention uses a simpler process requiring a lower temperature to replace the higher-temperature wet oxidation. As a result, the thermal budget of NROM fabrication is reduced and the degradation of the gate oxide due to high temperature is prevented so as to improve the problems caused by the prior art. Moreover, because of the high dielectric constant property of tantalum pentaoxide, both the coupling ratio and charge gain greatly increase and both the gate control voltage and the defect density decrease so as to improve both the production yield of NROM and fabrication cost.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for fabricating a nitride read only memory (NROM), the method comprising:

providing a substrate;

forming a oxide-nitride-oxide (ONO) layer on the surface of the substrate, the ONO layer composed of a bottom oxide layer, a silicon nitride layer and a top oxide layer composed of pentaoxide; and forming a gate conductor layer on the surface of the ONO layer;

wherein, said top oxide layer is used to reduce control gate voltage of the NROM and to increase both of coupling ratio and charge gain of the NROM.

2. The method of claim 1 wherein said top oxide layer is deposited by a chemical vapor deposition (CVD) method, and the fabrication temperature of the CVD method is between 200–650° C. and the pressure is between 200–600 mTorr.

3. The method of claim 1 wherein the thickness of the top oxide layer is between 60–800 angstroms.

4. The method of claim 1 wherein said top oxide layer is formed a reaction of tantalum penta ethoxide (Ta(OC$_2$H$_5$)$_5$) with oxygen, and a flow rate of the tantalum penta ethoxide is about 5–20 mg/min, and a flow rate of the oxygen gas is about 500–2000 mg/min.

5. The method of claim 4 wherein the reaction uses helium (He) as a carrier gas, and the flow rate of He is about 200–600 mg/min.

6. The method of claim 1 wherein the method further comprises anneal process after forming the top oxide layer.

7. The method of claim 6 wherein the annealing process is a rapid thermal nitridation (RTN) process, performed by using nitrous oxide gas at a temperature of 800° C. for a duration of 60 seconds.

* * * * *